US008018572B2

(12) United States Patent
Wassink

(10) Patent No.: US 8,018,572 B2
(45) Date of Patent: *Sep. 13, 2011

(54) LITHOGRAPHIC APPARATUS AND RADIATION SYSTEM

(75) Inventor: Arnoud Cornelis Wassink, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 391 days.

This patent is subject to a terminal disclaimer.

(21) Appl. No.: 12/222,430

(22) Filed: Aug. 8, 2008

(65) Prior Publication Data

US 2008/0304028 A1   Dec. 11, 2008

Related U.S. Application Data

(62) Division of application No. 11/317,246, filed on Dec. 27, 2005, now Pat. No. 7,426,018.

(60) Provisional application No. 60/639,316, filed on Dec. 28, 2004.

(51) Int. Cl.
*G03B 27/52* (2006.01)
*G03B 27/54* (2006.01)

(52) U.S. Cl. ........................... 355/30; 355/67

(58) Field of Classification Search ............ 355/30, 355/53, 67; 378/34; 250/492.1

See application file for complete search history.

(56) References Cited

U.S. PATENT DOCUMENTS

| 4,408,338 A | 10/1983 | Grobman |
| 4,837,794 A | 6/1989 | Riordan et al. |
| 4,872,189 A | 10/1989 | Frankel et al. |
| 5,023,897 A | 6/1991 | Neff et al. |
| 5,459,771 A | 10/1995 | Richardson et al. |
| 5,504,795 A | 4/1996 | McGeoch |
| 5,577,092 A | 11/1996 | Kublak et al. |
| 6,359,969 B1 | 3/2002 | Shmaenok |
| 6,838,684 B2 | 1/2005 | Bakker et al. |
| 7,034,308 B2 | 4/2006 | Bakker et al. |
| 7,057,190 B2 | 6/2006 | Bakker et al. |

(Continued)

FOREIGN PATENT DOCUMENTS

EP   1 274 287 A1   1/2003

(Continued)

OTHER PUBLICATIONS

European Search Report issued for European Patent Application 05078006.3-2222 dated Mar. 10, 2006.

*Primary Examiner* — Peter B Kim

(74) *Attorney, Agent, or Firm* — Pillsbury Winthrop Shaw Pittman LLP

(57) ABSTRACT

A lithographic apparatus includes a radiation system configured to form a projection beam of radiation. The radiation system includes a radiation source that emits radiation, a filter system for filtering debris particles out of the radiation beam, and an illumination system configured to condition a radiation beam. A projection system is configured to project the projection beam of radiation onto a substrate. The filter system includes a plurality of foils for trapping the debris particles. At least one foil includes at least two parts that have a mutually different orientation and that are connected to each other along a substantially straight connection line. Each of the two parts substantially coincide with a virtual plane that extends through a predetermined position that substantially coincides with the radiation source. The straight connection substantially line coincides with a virtual straight line that also extends through the predetermined position.

34 Claims, 5 Drawing Sheets

| U.S. PATENT DOCUMENTS | | | | FOREIGN PATENT DOCUMENTS | | |
|---|---|---|---|---|---|---|
| 7,106,832 B2 | 9/2006 | Klunder et al. | | EP | 1 434 098 A2 | 6/2004 |
| 7,145,132 B2 | 12/2006 | Bakker et al. | | EP | 1 434 098 A3 | 8/2004 |
| 7,332,731 B2 | 2/2008 | Klunder | | EP | 1 491 963 A2 | 12/2004 |
| 7,612,353 B2 * | 11/2009 | Sjmaenok et al. | 250/504 R | JP | 9-320792 | 12/1997 |
| 2005/0077483 A1 | 4/2005 | Bakker et al. | | JP | 2000-98098 | 4/2000 |
| 2006/0139604 A1 | 6/2006 | Wassink et al. | | JP | 2001-57298 | 2/2001 |
| 2006/0186353 A1 | 8/2006 | Wassink | | WO | 99/42904 A1 | 8/1999 |
| 2006/0219958 A1 | 10/2006 | Wassink | | WO | WO 01/37309 A1 | 5/2001 |
| 2006/0261290 A1 | 11/2006 | Van Herpen et al. | | WO | 03/034153 A2 | 4/2003 |
| 2007/0018118 A1 | 1/2007 | Sjmaenok et al. | | WO | 03/034153 A3 | 4/2003 |
| 2007/0023706 A1 | 2/2007 | Sjmaenok et al. | | | | |
| 2007/0146659 A1 | 6/2007 | Klunder | | | | |
| 2008/0067454 A1 | 3/2008 | Wassink | | | | |

* cited by examiner

LITHOGRAPHIC APPARATUS AND RADIATION SYSTEM

CROSS-REFERENCE TO RELATED APPLICATIONS

The present application is a divisional application of U.S. patent application Ser. No. 11/317,246, filed Dec. 27, 2005, now U.S. Pat. No. 7,426,018 which claims the benefit of priority from U.S. Provisional Patent Application No. 60/639,316, filed Dec. 28, 2004, the entire contents of which are both incorporated herein by reference.

FIELD

The present invention relates to a lithographic apparatus, and a radiation system.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the size of features that can be imaged onto the substrate is limited by the wavelength of the projection radiation. To produce integrated circuits with a higher density of devices, and hence higher operating speeds, it is desirable to image smaller features. While most current lithographic projection apparatus employ ultraviolet light generated by mercury lamps or excimer lasers, it has been proposed to use shorter wavelength radiation, in the range of 5 to 20 nm, in particular around 13 nm.

Such radiation is termed extreme ultra violet (EUV) or soft X-ray and possible sources include, for example, laser produced plasma sources, discharge plasma sources, or synchrotron radiation from electron storage rings. These types of radiation require that the beam path in the apparatus be evacuated to avoid beam scatter and absorption. Because there is no known material suitable for making a refractive optical element for EUV radiation, EUV lithographic apparatus must use mirrors in the radiation (illumination) and projection systems. Even multilayer mirrors for EUV radiation have relatively low reflectivities and are highly susceptible to contamination, further reducing there reflectivities and hence throughput of the apparatus. This may impose further specifications on the vacuum level to be maintained and may necessitate especially that hydrocarbon partial pressures be kept very low.

In a typical discharge plasma source, plasma is formed by an electrical discharge. The plasma may then be caused to compress so that is becomes highly ionized and reaches a very high temperature, thereby causing the emission of EUV radiation. The material used to produce the EUV radiation is typically xenon or lithium vapor, although other gases such as krypton or tin or water, may also be used. However, these gases may have a relatively high absorption of radiation within the EUV range and/or be damaging to optics further downstream of the projection beam and their presence should therefore be minimized in the remainder of the lithographic apparatus. A discharge plasma source is disclosed, for example, in U.S. Pat. Nos. 5,023,897 and 5,504,795, both of which are incorporated herein by reference.

In a laser produced plasma source, a jet of, for example, (clustered) xenon may be ejected from a nozzle, for example produced from an ink-jet like nozzle as droplets or thin wire. At some distance from the nozzle, the jet is irradiated with a laser pulse of a suitable wavelength for creating a plasma that subsequently will radiate EUV radiation. Other materials, such as water droplets, ice particles, lithium or tin, etc. may also be ejected from a nozzle and be used for EUV generation. In an alternative laser-produced plasma source, an extended solid (or liquid) material is irradiated to create a plasma for EUV radiation. Laser produced plasma sources are, for example, disclosed in U.S. Pat. Nos. 5,459,771, 4,872,189 and 5,577,092, each of which are incorporated herein by reference.

During generation of EUV radiation, particles are released. These particles, hereinafter referred to as debris particles, include ions, atoms, molecules and small droplets. These particles should be filtered out of the EUV radiation, as these particles may be detrimental to the performance and/or the lifetime of the lithographic apparatus, in particular the illumination and projection system thereof.

International Patent Application Publication No. WO 99/42904, incorporated herein by reference, discloses a filter that is, in use, situated in a path along which the radiation propagates away from the source. The filter may thus be placed between the radiation source and, for example, the illumination system. The filter includes a plurality of foils or plates that, in use, trap debris particles, such as atoms and microparticles. Also, clusters of such microparticles may be trapped by these foils or plates. These foils or plates are orientated such that the radiation can still propagate through the filter. The plates may be flat or conical and may be arranged radially around the radiation source. The source, the filter and the projection system may be arranged in a buffer gas, for example, krypton, whose pressure is about 0.5 torr. Contaminant particles then take on the temperature of the buffer gas, for example, room temperature, thereby sufficiently reducing the particles velocity before the end of the filter. This enhances the likelihood that the particles are trapped by the foils. The pressure in this known contaminant trap is about equal to that of its environment, when such a buffer gas is applied.

International Patent Application Publication No. WO 03/034153, incorporated herein by reference, discloses a contaminant trap that includes a first set of foils and a second set of foils, such that radiation leaving the source first passes the first set of foils and than the second set of foils. The plates, or foils, of the first and second set define a first set of channels and a second set of channels, respectively. The two sets of channels are spaced apart leaving between them a space into which flushing gas is supplied by a gas supply. An exhaust system may be provided to remove gas from the contaminant trap. The pressure of the gas and the space between the two sets of channels may be relatively high so that debris particles are efficiently slowed down, further enhancing the likelihood that debris particles are trapped by the second set of foils. The first and second set of channels provide a resistance to the gas when the gas moves from the space between the two sets of channels in the channels of either the first or the second set. Hence, the presence of the gas is more or less confined to the space between the two sets of channels.

Even though the platelets or foils are positioned such that radiation diverging from the radiation source can easily pass through the contaminant trap, the foils or platelets do absorb some EUV radiation and, therefore, some heat. Moreover, these foils are heated by colliding and impact of debris particles. This may result in a significant heating of the foils and heating of a supporting structure that supports the foils. This may lead to thermal expansion of the foils and supporting structure. As optical transmission of the contaminant trap is very important in a lithographic apparatus, deformation of a foil due to thermal expansion of the foil should be minimized.

European Patent Application Publication No. EP 1 434 098 addresses this problem by providing a contamination barrier, i.e. a foil trap or contaminant trap, that includes an inner ring and an outer ring in which each of the foils or plates is slidably positioned at least one of its outer ends in grooves of at least one of an inner ring and outer ring of a supporting structure. By slidably positioning one of the outer ends of the foils or plates, the foils or plates can expand in a radial direction without the appearance of mechanical tension, and thus without thermally induced mechanical deformation of the plates or foil. The contamination trap may include a cooling system arranged to cool one of the rings to which the plate or foils are thermally connected.

SUMMARY

It is desirable to provide a lithographic apparatus having a filter system, an illumination system having a filter system, or a filter system itself, in which despite heating up of the filter system, an acceptable performance of the filter system in terms of its optical transmission remains possible.

According to an aspect of the invention, there is provided a lithographic apparatus. The lithographic apparatus includes a radiation system configured to form a projection beam of radiation. The radiation system includes a radiation source that emits radiation, a filter system for filtering debris particles out of the radiation emitted by the radiation source, and an illumination system configured to form the radiation emitted by the radiation source into a conditioned radiation beam. The filter system includes a plurality of foils for trapping the debris particles. At least one foil of the plurality of foils includes at least two parts that have a mutually different orientation and that are connected to each other along a substantially straight connection line. Each of the two parts substantially coincides with a virtual plane that extends through a predetermined position that substantially coincides with the radiation source. The substantially straight connection line coincides with a virtual straight line that also extends through the predetermined position. The apparatus also includes a projection system configured to project the projection beam of radiation onto a substrate.

According to an aspect of the invention, there is provided a radiation system configured to form a beam of radiation. The radiation system includes a radiation source that emits radiation, a filter system for filtering debris particles out of the radiation emitted by the radiation source, and an illumination system configured to form the radiation emitted by the radiation source into a conditioned radiation beam. The filter system includes a plurality of foils for trapping the debris particles. At least one foil of the plurality of foils includes at least two parts that have a mutually different orientation and that are connected to each other along a substantially straight connection line. Each of the two parts substantially coincides with a virtual plane that extends through a predetermined position that substantially coincides with the radiation source. The substantially straight connection line coincides with a virtual straight line that also extends through the predetermined position.

According to an aspect of the invention, there is provided a filter system for filtering debris particles out of radiation emitted by a radiation source, and usable for lithography, in particular EUV lithography. The filter system includes a plurality of foils for trapping the debris particles. At least one foil of the plurality of foils includes at least two parts that have a mutually different orientation and that are connected to each other along a substantially straight connection line. Each of the two parts substantially coincides with a virtual plane that extends through a predetermined position that substantially coincides with the radiation source. The substantially straight connection line coincides with a virtual straight line that also extends through the predetermined position.

Upon heating of the foils, the foils will thermally expand. The foils that comprise two parts having mutually different orientations, comprise effectively a predetermined line at which thermal expansion of both parts is effected. This predetermined line will be translated as a consequence of the thermal expansion of each part. This allows for a design of the foils wherein the thermal expansion is controllable and predictable. Furthermore, as the predetermined line, i.e. the straight connection line, coincides with a virtual straight line that also extends through the position from which radiation propagates, the translation of that line will only cause a minimal drop in optical transmission, if at all, caused by the thermal expansion of that foil.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
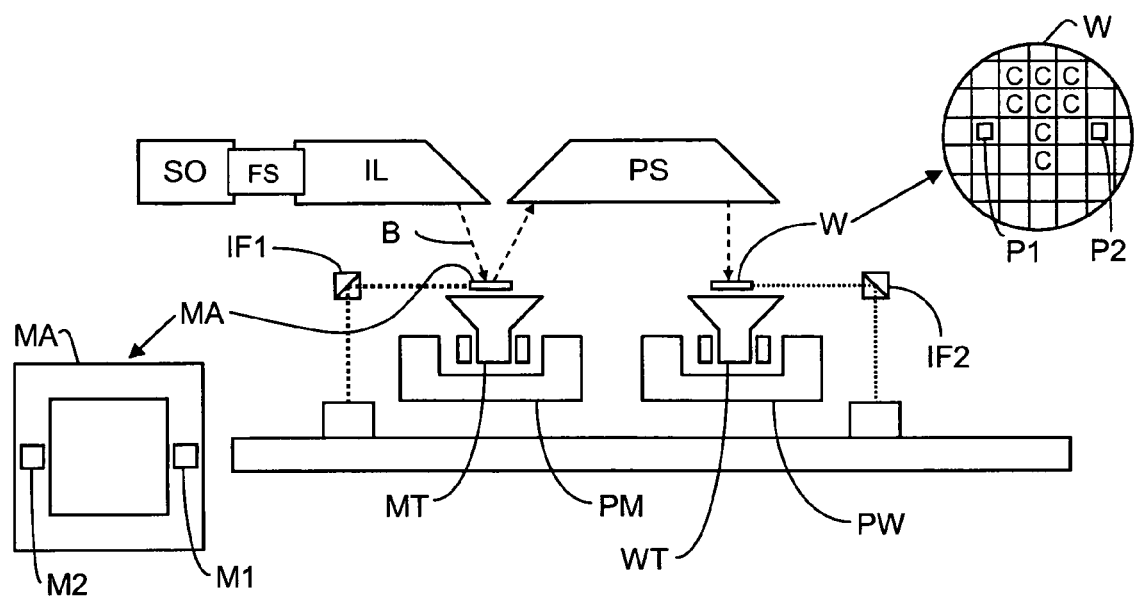
FIG. 1 schematically depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation EUV radiation or X-ray radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" as used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. In a path along which radiation propagates from the source SO towards the illuminator, a filter system FS is provided. The filter system FS substantially transmits the radiation and filters debris particles out of the radiation. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases the source may be an integral part of the lithographic apparatus, for example when the source is a mercury lamp. The source SO and the illuminator IL, together with the beam delivery system if required, may be referred to as a radiation system.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus may be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
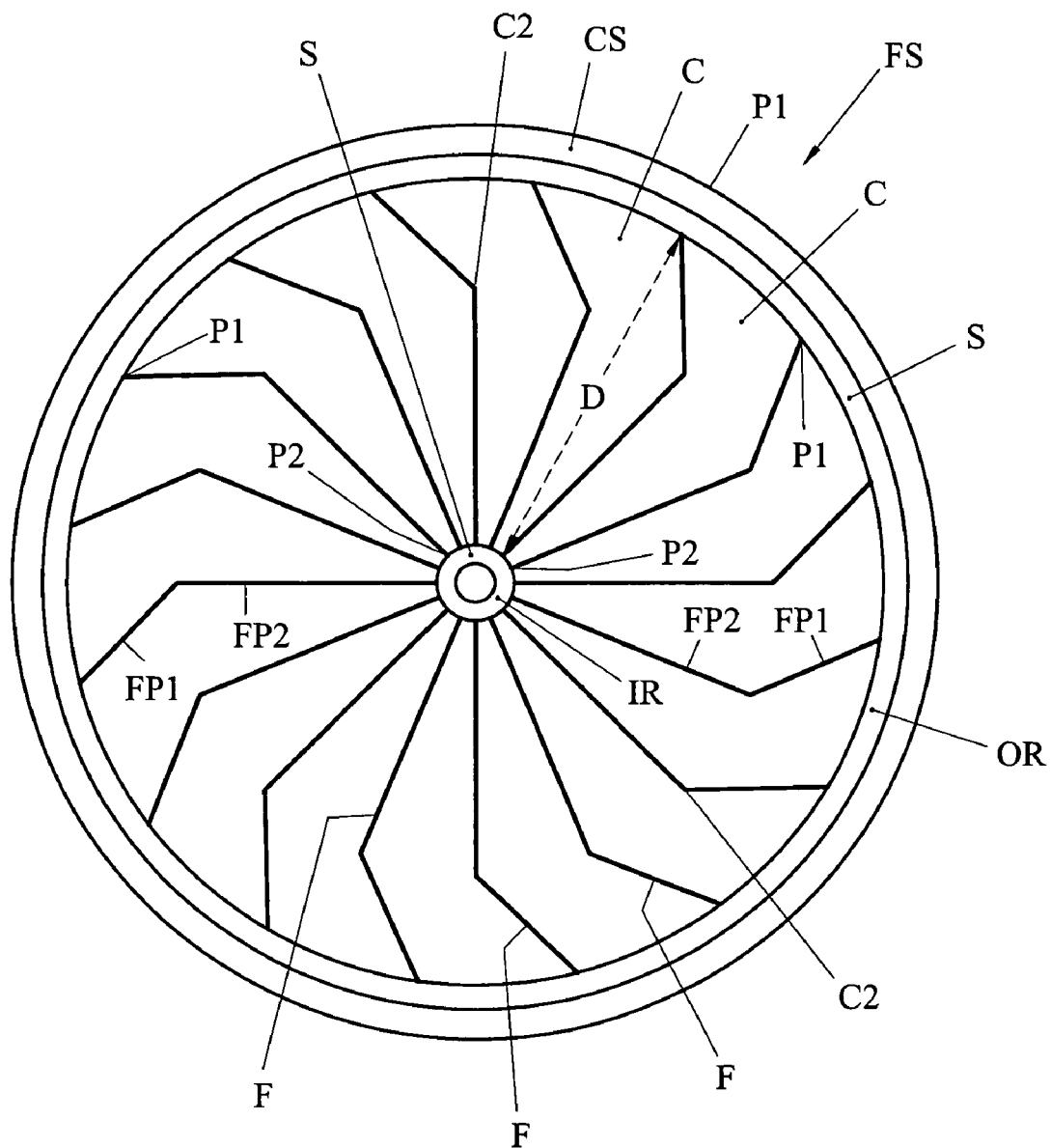
FIG. 2 schematically depicts a part of a lithographic apparatus, of an illumination system and a filter system according to an embodiment of the invention.
Figure 3:
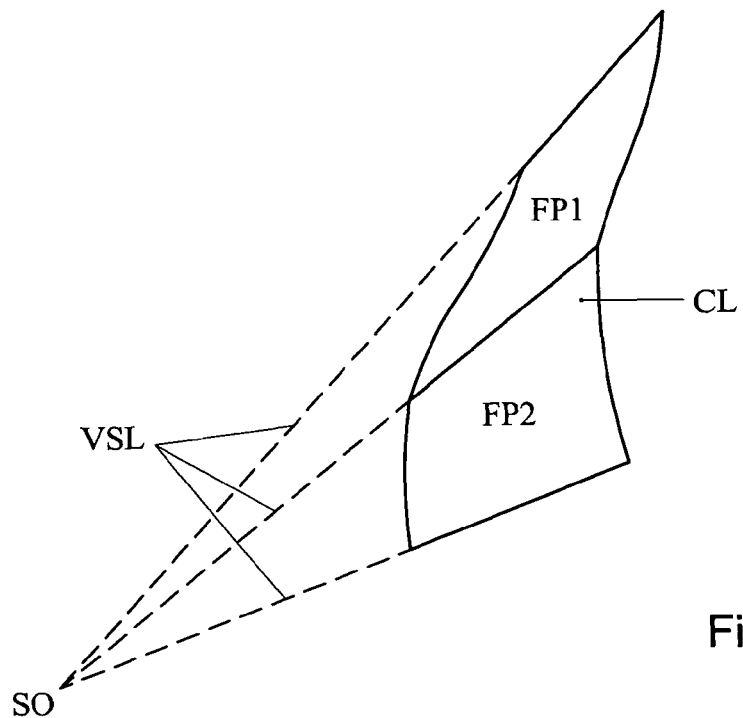
FIG. 3 schematically depicts a foil as a part of a lithographic apparatus, of an illumination system and of a filter system according to an embodiment of the invention.
Figure 4:
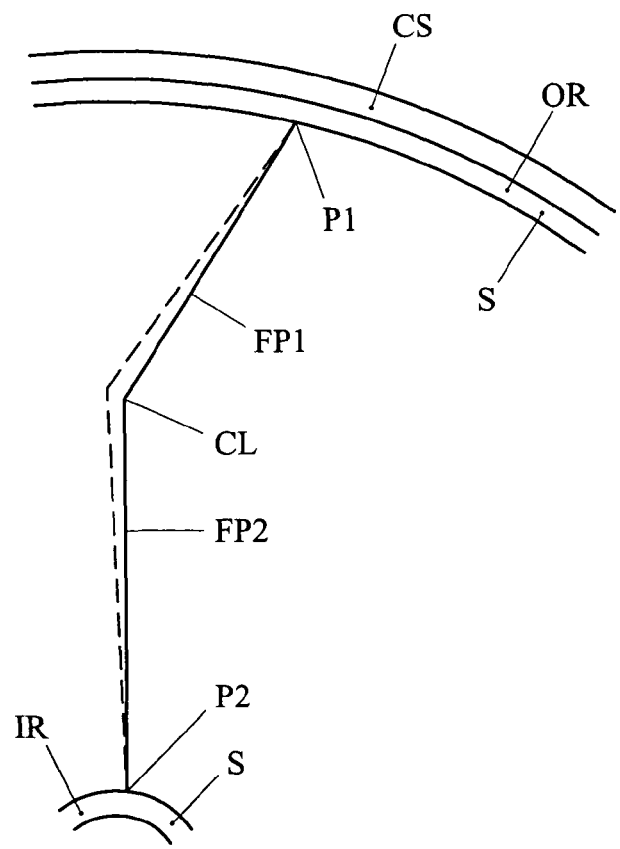
FIG. 4 schematically depicts a foil heated up as part of a lithographic apparatus, of an illumination system and of a filter system according to an embodiment of the invention.

FIG. 2 schematically depicts a filter system FS for filtering debris particles out of the radiation beam. The filter system shown in FIG. 2 is depicted as viewed from a predetermined position that is in use intended to substantially coincide with a source from which the radiation is generated. The filter system FS includes a plurality of foils F for trapping the debris particles. As will be discussed below, from this viewing position, the foils are seen as lines. FIG. 3 and FIG. 4 show one of these foils F, in, respectively, a perspective view and view similar to that of FIG. 2. Each of the foils F includes two parts FP1, FP2 that have a mutually different orientation. The two parts F1, FP2 are connected to each other along a substantially straight connection line CL, which is more clearly shown in FIG. 3. Each of the two parts FP1 FP2 coincide with a virtual plane (not shown) that extends through the predetermined position from which the filter system FS is seen in FIG. 2. This is schematically indicated by the virtual straight lines VSL, shown in FIG. 3. As indicated earlier, this predetermined position is, in use, intended to substantially coincide with a source from which the radiation is generated. The source SO is schematically indicated in FIG. 3. The straight connection line CL also coincides with a virtual straight line VSL that extends through the predetermined position, i.e. through the position that is intended to substantially coincide with the source SO from which the radiation is generated. In use, radiation generated from the source, propagates through the filter system. Only a small portion of the radiation will hit the foils frontally and may as such be absorbed by the foil, thereby resulting in heating the foil. Debris particles, traveling along a path into which the radiation propagates, may be trapped by the foils F as their direction of velocity is likely to have a component towards one of the foils F. It is also possible to rotate the foil trap such that the foils intercept the debris particles when these particles travel through the channels C formed by the foils F. In addition to the absorbance of radiation, the foils F also heat up, due to the impact of these particles.

The filter system FS includes a support S to which a first part FP1 of the two parts FP1, FP2 is connected at a first position P1 of the support S, while a second part FP2 of the two parts FP1, FP2 is connected at a second position P2 of the support S. In the embodiment shown in FIG. 2, the support S includes an inner ring IR and an outer ring OR. The inner ring IR and the outer ring OR are coaxial. A distance D between the first position P1 and the second position P2 is fixed. The foils F may be made of a material substantially including molybdenum. Also, the supports may be made of a material that substantially includes molybdenum. The foils F may be connected to the support S by soldering.

The behavior of the foil trap shown in FIG. 2, when, in use, is as follows. Each part FP1, FP2 of a foil F expands when heated up. The expansion occurs substantially within a plane in which the respective part lies. The expansion of the foil F is accommodated for by a movement of the connection line substantially sideways with respect to the overall orientation of the foil. The extent to which the connection line moves is even more predictable when the distance D between position P1 and position P2 is fixed. Foil F when heated up is in FIG. 4 schematically shown by a dashed line.

A new orientation of the foil F, when heated up, has become predictable due to the position of the connection line CL. As the straight connection line coincides with a virtual straight line that extends through the predetermined position which is in use intended to substantially coincide with a source from which the radiation is generated, and each of the two parts FP1, FP2 coincide with a virtual plane that extends through that predetermined position, a new position and orientation of the foil will only cause a minimal drop in optical transmission, if at all. Furthermore, it is possible, for example, to experimentally determine the thermal expansion and the new position of a foil when heated up, and to design the filter system such that when the filter system is exposed to the absorbance of EUV radiation and/or impact of debris particles, the foil adopts an orientation which allows for optimal transmission of (EUV) radiation.

Each part of the two parts FP1, FP2 may coincide with a virtual plane that is a straight plane. The controllability and predictability would then be even more straight forward. However it is possible that each part, or one of the parts FP1, FP2 includes a curvature. The embodiment shown in FIGS. 2 and 4 is focused on a cylindrical or conical filter system FS, i.e. a filter system having a cylindrical or conical outer ring and possibly a cylindrical or conical inner ring. However, in principle, any other shape of the support and the filter system is possible.

Fixation of the distance D between position P1 and position P2 of the support S is relative to the thermal expansion of the foil F. It is thus possible that the distance D may slightly increase due to expansion of the support, i.e. in this case inner ring IR and outer ring OR. Schematically is shown in FIGS. 2 and 4 that the support may be cooled by a cooling system CS. For the sake of clarity, this cooling system CS is only shown to be present at the outer ring OR. It is, however, equally possible to provide a cooling system CS at the inner ring IR.

Figure 5:
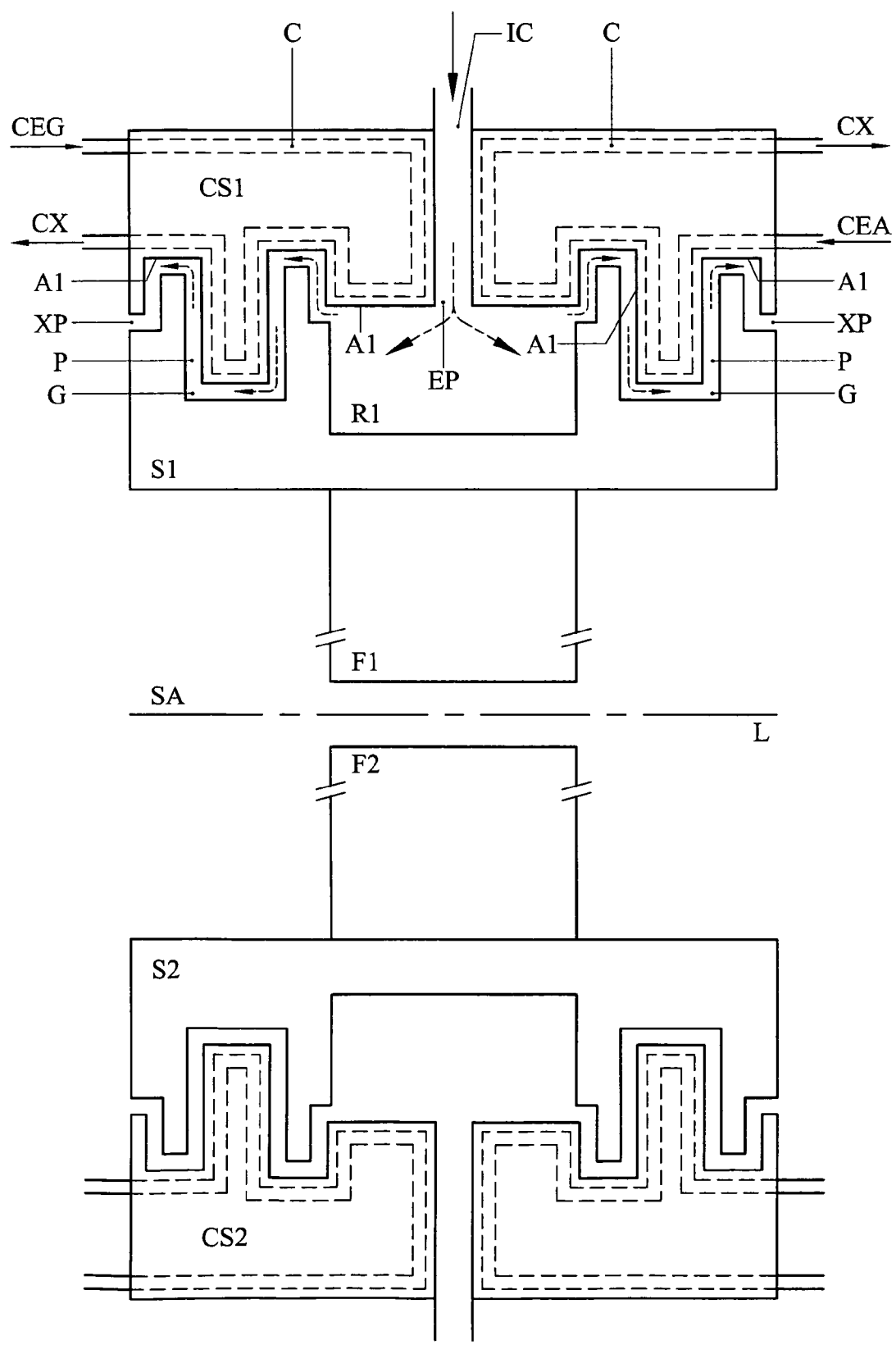
FIG. 5 schematically depicts a part of a lithographic apparatus, an illumination system and of a filter system according to an embodiment of the invention.
Figure 6:
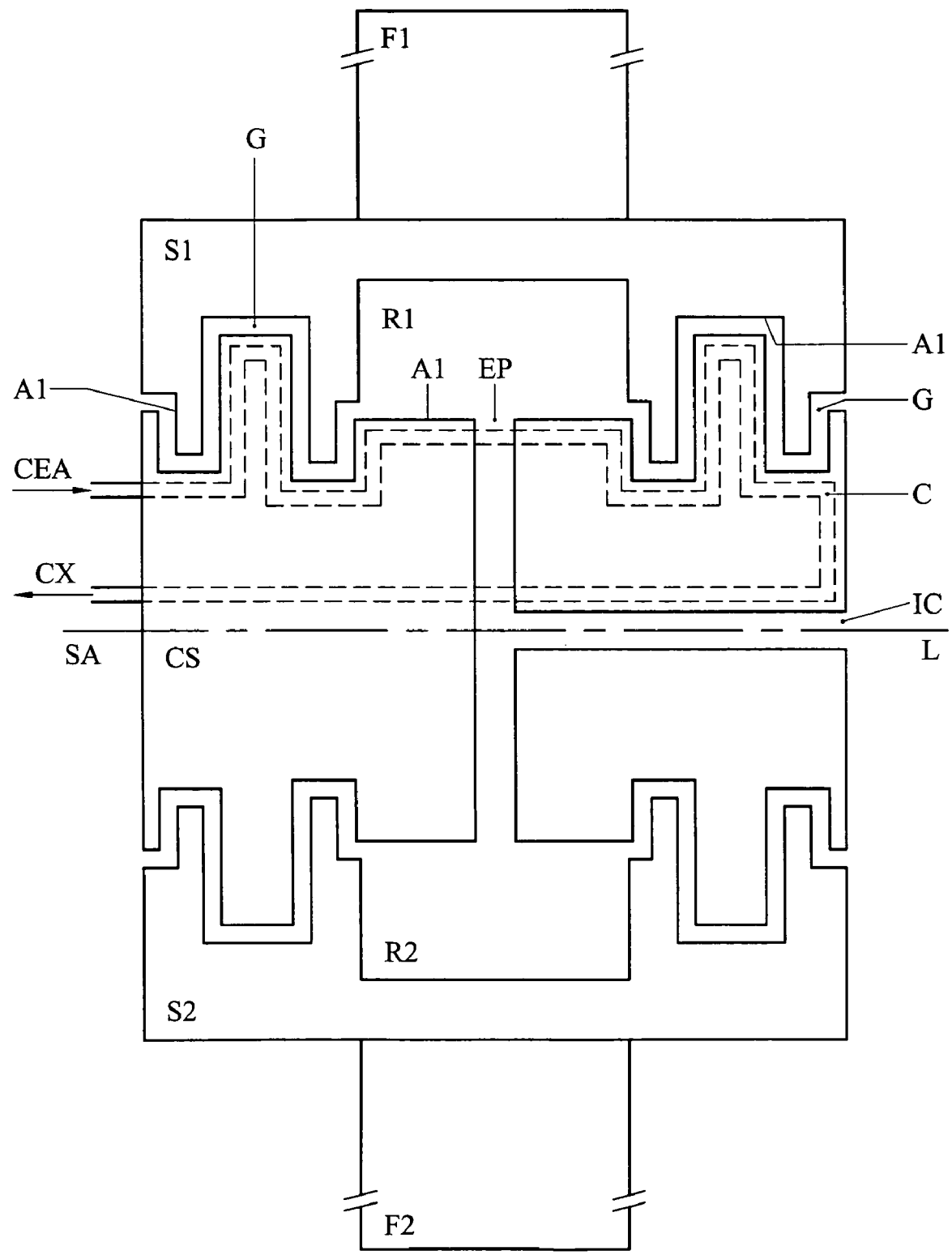
FIG. 6 schematically depicts a part of a lithographic apparatus, an illumination system and of a filter system according to an embodiment of the invention.

FIGS. 5 and 6 show a part of an embodiment of a filter system FS according to the invention, that reveals in more detail a construction of the cooling system CS and the way in which this cooling system CS may work.

In FIG. 5, foil F1 and foil F2 are part of a filter system FS for trapping debris particles. The filter system also includes a support, in FIG. 5 shown as part S1 and part S2. It is possible that part S1 and part S2 both belong to one ring-shaped support. FIG. 5 may be seen as showing a schematic cross-section of such a ring-shaped support. A symmetry axis SA is schematically represented by line L. Foil F1 and foil F2 may both be connected to an axis (not shown) of the support. In that case, this axis may coincide with line L. In an embodiment where the support, including support parts S1 and S2, is ring-shaped, symmetry axis SA may coincide with a virtual straight line that extends through a predetermined position that is intended to coincide with a source from which radiation is generated.

It is further possible that foil F1 and foil F2 are connected, i.e. form together one foil. It is in such an embodiment possible that support S1 and support S2 are separated supports, that is, separated by the foil which is formed by connecting foil F1 and foil F2. For example, support S1 may represent a cross-section of an outer ring, while support S2 represents a cross-section of an inner ring. In that situation, line L does not represent a symmetry-axis.

It is also possible that line L represents a plane of symmetry and that the filter system includes a plurality of foils which are parallel to each other.

The filter system includes a cooling system CS. This cooling system CS may include parts CS1 and CS2.

In cases where the respective support is ring-shaped, the respective cooling system CS may also be ring-shaped. Line L may in some embodiments thus also represent the symmetry axis of the cooling system CS. For a further description of the part of the filter system shown in FIG. 5, reference is only made to the upper part, i.e. above line L. The description of the upper part also holds for the lower part.

The cooling system CS1 has a surface A1 that is arranged to be cooled. The cooling system CS1 and the support S1 are positioned with respect to each other such that a gap G is formed between the surface A1 of the cooling system CS1 and the support S1. The cooling system CS1 is further arranged to inject gas into the gap G. The gas and its flow direction is indicated by dotted arrows. The path P between an entrance position EP at which the gas enters the gap G and an exit position XP from which the gas exits the gap G forms in the embodiment shown in FIG. 5 a meandering path P. As the path P is a meandering path, gas injected into the gap experiences a large resistance when flowing from the entrance position EP towards the exit position XP. Such a meandering path provides resistance to leakage of gas from the gap G towards its surrounding. It is also possible that the path is a straight path. The resistance experienced by the gas when moving towards exit position XP is then lower, as compared to the embodiment shown. The support S1 may be provided with a recess R1 for holding the gas before the gas exits gap G. The pressure in this recess may be about 1000 Pa whereas the pressure of the surroundings may be about 10 Pa. The recess R1 may thus provide a buffer in which injected gas cools the support S1.

The gap G may be such that a smallest distance between the surface A1 and the support S1 is in a range that varies from about 20 micrometers to about 200 micrometers. The gap may also be such that the smallest distance between the surface A1 and the support S1 is in a range that varies from about 40 micrometers to about 100 micrometers.

The surface A1 of the cooling system CS1 is arranged to be cooled with a fluid. For this purpose, the cooling system CS1 may include a channel that extends in a subsurface of surface A1. In use, water, that is, relatively cool water, may enter channel entrance CEA and run through the channel C, and leave the channel at channel exit CX. In that case the subsurface of surface A1 will be cooled with water still about as cool as the water that enters the channel C at channel entrance CEA. The cooling system CS1 may also be arranged to cool the gas before injecting the gas into the gap G. Instead of having an entrance for water at a position indicated by channel entrance CEA, it may be advantageous to let water into the channel at a position indicated by CEG, so that water first runs along an injection channel IC through which in use gas is injected into the gap G. This allows for cooling the gas in the injection channel IC or for further keeping the gas cool in the injection channel in cases where the gas has been cooled before entering the injection channel IC. It is, of course, also possible that the injection channel IC and the surface A1 are cooled by independent cooling mechanisms. Instead of using water, any other suitable cooling medium may be used. Although not shown, it will be clear that entrances and exits of channel C are connected with supplies and exhausts, respectively, such that no water and/or any other cooling medium used for cooling the cooling system will enter the surroundings of the cooling system and/or the filter system. Gas injected via injection channel IC into the gap G may be Argon, or any other gas that has good cooling properties and is relatively inert.

When the filter system is exposed to EUV radiation and filters debris particles out of the path along which the EUV radiation propagates towards a collection system, and the filter system rotates at about 3,000 rpm in a vacuum environment, the foils and their support(s) are likely to absorb about 1 kW of power as a result of absorption of EUV radiation and impact of debris particles on foils. Without wishing to be bound by any theory, it is indicated that it is possible to remove an amount of heat equal to about 1.3 kW when Argon gas is injected into the gap G such that a pressure of about 1000 Pa in the recess R1 is reached, the temperature difference between the support and the cooled surface of the cooling system CS1 is about 200K, and the surface A1 includes an area of about $1.26*10^{-2}$ m$^2$. The heat transfer coefficient is in this consideration taken to be about 0.7 W/m$^2$*K*Pa and the efficiency is assumed to be about 0.85. The shortest distance between the support S1 and the surface A1 in the gap is assumed to be between about 40 and about 100 micrometers. Pressure in the surroundings may in that case be about 10 mbar. In this assessment, the material of which the support is made, is assumed to be stainless steel having a thickness of about 2 cm and a diameter of about 200 mm.

FIG. 6 depicts another part of a lithographic apparatus, illumination system, and filter system according to an embodiment of the invention. In this situation, the support S1 and S2 include parts of a ring-shaped support that is rotatably arranged around a symmetry axis SA and a cooling system CS, which may, in use, remain stationary with respect to the support of which parts S1 and S2 are schematically shown. The foils F1, F2 extend radially with respect to the symmetry axis SA. There may be one injection channel IC splitting in a part leading towards recess R1 and a part leading towards recess R2. Further structural features are the same as depicted in FIG. 5. The cooling system CS shown in FIG. 6 works the same as the cooling system shown in FIG. 5. It is possible that the support S1, S2 is rotatable due to a driving mechanism that transmits forces towards an outer ring (not shown) to which the foils F1, F2 in such an embodiment are connected. However, it also possible that the support S1, S2 are actually connected to cooling system CS via, for example thermally insulating connections, and that the cooling system CS drives rotation of the support S1, S2. In this latter embodiment it is not necessarily the case that the foils F1, F2 are connected to for example an outer ring.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" as used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
    a radiation system configured to form a projection beam of radiation, comprising:
    (a) a radiation source that emits radiation;
    (b) a filter system for filtering debris particles out of the radiation emitted by the radiation source, the filter system including a plurality of foils for trapping the debris particles, at least one foil of the plurality of foils including a first part and a second part that have mutually different orientations and that are connected to each other along a substantially straight connection line, the first part substantially coinciding with a first virtual plane that extends through a predetermined position that substantially coincides with the radiation source, the second part substantially coinciding with a second virtual plane that extends through the predetermined position that substantially coincides with the radiation source, and the substantially straight connection line coinciding with a virtual straight line that also extends through the predetermined position; and
    (c) an illumination system configured to form the radiation emitted by the radiation source into a conditioned radiation beam; and
    a projection system configured to project the projection beam of radiation onto a substrate.

2. A lithographic apparatus according to claim 1, wherein the filter system includes a support to which the first part is connected at a first position of the support, and to which the second part is connected at a second position of the support.

3. A lithographic apparatus according to claim 2, wherein a distance between the first and second position is fixed.

4. A lithographic apparatus according to claim 2, wherein the support comprises an inner ring and an outer ring.

5. A lithographic apparatus according to claim 4, wherein the inner ring and the outer ring are coaxial.

6. A lithographic apparatus according to claim 2, wherein at least a part of the filter system is arranged to, at least in use, cool the support.

7. A lithographic apparatus according to claim 2, wherein the filter system further includes a cooling system having a surface that is arranged to be cooled, the cooling system and the support being positioned with respect to each other such that a gap is formed between the surface of the cooling system and the support, and wherein the cooling system is arranged to inject gas into the gap.

8. A lithographic apparatus according to claim 7, wherein a path between an entrance position at which the gas enters the gap and an exit position from which the gas exits the gap forms a meandering path.

9. A lithographic apparatus according to claim 7, wherein the gap is such that a smallest distance between the surface of the cooling system and the support is in a range from about 20 micrometers to about 200 micrometers.

10. A lithographic apparatus according to claim 9, wherein the gap is such that a smallest distance between the surface of the cooling system and the support is in a range from about 40 micrometers to about 100 micrometers.

11. A lithographic apparatus according to claim 7, wherein the support is rotatable with respect to the surface of the cooling system.

12. A lithographic apparatus according to claim 7, wherein the surface of the cooling system is arranged to be stationary with respect to the support.

13. A lithographic apparatus according to claim 7, wherein the surface of the cooling system is arranged to be cooled with a fluid.

14. A lithographic apparatus according to claim 13, wherein the fluid is water.

15. A lithographic apparatus according to claim 7, wherein the gas is argon.

16. A lithographic apparatus according to claim 7, wherein the support is provided with a recess for holding the gas before the gas flows through the gap.

17. A lithographic apparatus according to claim 7, wherein the cooling system is arranged to cool the gas before injecting the gas in the gap.

18. A radiation system configured to form a projection beam of radiation, the radiation system comprising:
- a radiation source that emits radiation;
- a filter system for filtering debris particles out of the radiation emitted by the radiation source, the filter system including a plurality of foils for trapping the debris particles, at least one foil of the plurality of foils including a first part and a second part that have mutually different orientations and that are connected to each other along a substantially straight connection line, the first part substantially coinciding with a first virtual plane that extends through a predetermined position that substantially coincides with the radiation source, the second part substantially coinciding with a second virtual plane that extends through the predetermined position that substantially coincides with the radiation source, and the substantially straight connection line coinciding with a virtual straight line that also extends through the predetermined position; and
- an illumination system configured to form the radiation emitted by the radiation source into a conditioned radiation beam.

19. A radiation system according to claim 18, wherein the filter system includes a support to which the first part is connected at a first position of the support and to which the second part is connected at a second position of the support.

20. A radiation system according to claim 19, wherein a distance between the first and second position is fixed.

21. A radiation system according to claim 19, wherein the support comprises an inner ring and an outer ring.

22. A radiation system according to claim 21, wherein the inner ring and the outer ring are coaxial.

23. A radiation system according to claim 19, wherein at least a part of the filter system is arranged to cool the support.

24. A radiation system according to claim 19, wherein the filter system further includes a cooling system having a surface that is arranged to be cooled, the cooling system and the support being positioned with respect to each other such that a gap is formed between the at least one surface of the cooling system and the support, and wherein the cooling system is arranged to inject gas into the gap.

25. A radiation system according to claim 24, wherein a path between an entrance position at which the gas enters the gap and an exit position from which the gas exits the gap forms a meandering path.

26. A radiation system according to claim 24, wherein the gap is such that a smallest distance between the surface of the cooling system and the support is in a range from about 20 micrometers to about 200 micrometers.

27. A radiation system according to claim 26, wherein the gap is such that a smallest distance between the surface of the cooling system and the support is in a range from about 40 micrometers to about 100 micrometers.

28. A radiation system according to claim 24, wherein the support is rotatable with respect to the surface of the cooling system.

29. A radiation system according to claim 24, wherein the surface of the cooling system is arranged to be stationary with respect to the support.

30. A radiation system according to claim 24, wherein the surface of the cooling system is arranged to be cooled with a fluid.

31. A radiation system according to claim 30, wherein the fluid is water.

32. A radiation system according to claim 24, wherein the gas is argon.

33. A radiation system according to claim 24, wherein the support is provided with a recess for holding the gas before the gas flows through the gap.

34. A radiation system according to claim 24, wherein the cooling system is arranged to cool the gas before injecting the gas in the gap.

* * * * *